US006838706B2

(12) United States Patent
Watanabe et al.

(10) Patent No.: US 6,838,706 B2
(45) Date of Patent: Jan. 4, 2005

(54) GROUP III NITRIDE COMPOUND SEMICONDUCTOR LIGHT-EMITTING DEVICE WHICH EMITS LIGHT HAVING A WAVELENGTH IN A RANGE FROM 360 TO 550 NM

(75) Inventors: Hiroshi Watanabe, Aichi (JP); Jun Ito, Aichi (JP); Shinya Asami, Aichi (JP); Naoki Shibata, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/332,024

(22) PCT Filed: Jul. 3, 2001

(86) PCT No.: PCT/JP01/05769

§ 371 (c)(1),
(2), (4) Date: Jan. 2, 2003

(87) PCT Pub. No.: WO02/03517

PCT Pub. Date: Jan. 10, 2002

(65) Prior Publication Data

US 2003/0189218 A1 Oct. 9, 2003

(30) Foreign Application Priority Data

Jul. 3, 2000 (JP) .................................... P2000-201563
Oct. 23, 2000 (JP) .................................... P2000-323231

(51) Int. Cl.$^7$ ............................ H01L 29/78; H01L 33/00
(52) U.S. Cl. ........................ 257/103; 257/101; 257/102; 257/89; 257/90
(58) Field of Search .............................. 257/76, 78, 79, 257/89, 90, 101–103, 200, 201, 431; 117/97, 106, 952

(56) References Cited

U.S. PATENT DOCUMENTS

| 5,496,766 A | * | 3/1996 | Amano et al. ................. 438/29 |
| 5,557,115 A | | 9/1996 | Shakuda |
| 5,751,752 A | | 5/1998 | Shakuda |
| 5,777,350 A | * | 7/1998 | Nakamura et al. ............. 257/96 |
| 5,851,905 A | | 12/1998 | McIntosh et al. |
| 6,084,899 A | | 7/2000 | Shakuda |

FOREIGN PATENT DOCUMENTS

| JP | 10-163571 | | 6/1998 |
| JP | 11-312841 | | 11/1999 |
| JP | 11-330547 | | 11/1999 |
| JP | 2000-91629 | | 3/2000 |
| JP | 2000-0916129 A | * | 3/2000 |
| JP | 2000-0916131 A | * | 3/2000 |
| JP | 2000-100735 | | 4/2000 |
| JP | 2000-133884 | | 5/2000 |
| JP | 2001-15443 | | 1/2001 |
| WO | WO 00/04615 A1 | * | 1/2000 |

* cited by examiner

*Primary Examiner*—Nathan J. Flynn
*Assistant Examiner*—Thomas L Dickey

(57) ABSTRACT

In a group III nitride compound semiconductor light-emitting device, a light-emitting layer having a portion where an InGaN layer is interposed between AlGaN layers on both sides thereof is employed. By controlling the thickness, growth rate and growth temperature of InGaN layer which is a well layer and the thickness of AlGaN layer which is a barrier layer so that they are optimized, the output of the light-emitting device is enhanced.

35 Claims, 8 Drawing Sheets

GROUP III NITRIDE COMPOUND SEMICONDUCTOR LIGHT-EMITTING DEVICE WHICH EMITS LIGHT HAVING A WAVELENGTH IN A RANGE FROM 360 TO 550 NM

TECHNICAL FIELD

The present invention relates to a group III nitride compound semiconductor light-emitting device. More particularly, the present invention relates to a group III nitride compound semiconductor light-emitting device which emits light having a relatively short wavelength.

BACKGROUND OF THE INVENTION

A group III nitride compound semiconductor light-emitting device is known as a light-emitting diode which emits a light having a color ranging from blue to green. Such a group III nitride compound semiconductor light-emitting device is used also as a light-emitting diode which emits light having a wavelength shorter than the visible light (near ultraviolet to ultraviolet).

A group III nitride compound semiconductor light-emitting device which emits short wavelength light has been heretofore known, but such a light-emitting device has recently been required to have a higher light-emitting efficiency and output.

DISCLOSURE OF THE INVENTION

The inventors made extensive studies of improvements in group III nitride compound semiconductor light-emitting devices which emit short wavelength light. As a result, the following light-emitting device has been devised. In other words, a group III nitride compound semiconductor light-emitting device which emits light having a wavelength of from 360 nm to 550 nm and comprises a light-emitting layer having a portion where an InGaN layer is interposed between AlGaN layers on both sides thereof has been obtained.

In accordance with the group III nitride compound semiconductor light-emitting device thus arranged, light having a short wavelength (wavelength of from 360 nm to 550 nm in the aforementioned arrangement) can be emitted at a higher output than conventional products.

Further, in the aforementioned arrangement, the thickness, growth rate and growth temperature of InGaN layer which is a well layer are controlled, the thickness of AlGaN layer which is a barrier layer is controlled, and the sum of the thickness of the well layer and the barrier layer adjacent thereto is controlled, optimizing these factors. In this manner, the output of the group III nitride compound semiconductor light-emitting device is enhanced.

Further, the interlayer which is a primary coat for the light-emitting layer is optimized, and from this standpoint of view, too, the enhancement of the output of the group III nitride compound semiconductor light-emitting device is aimed at.

Figure 1:
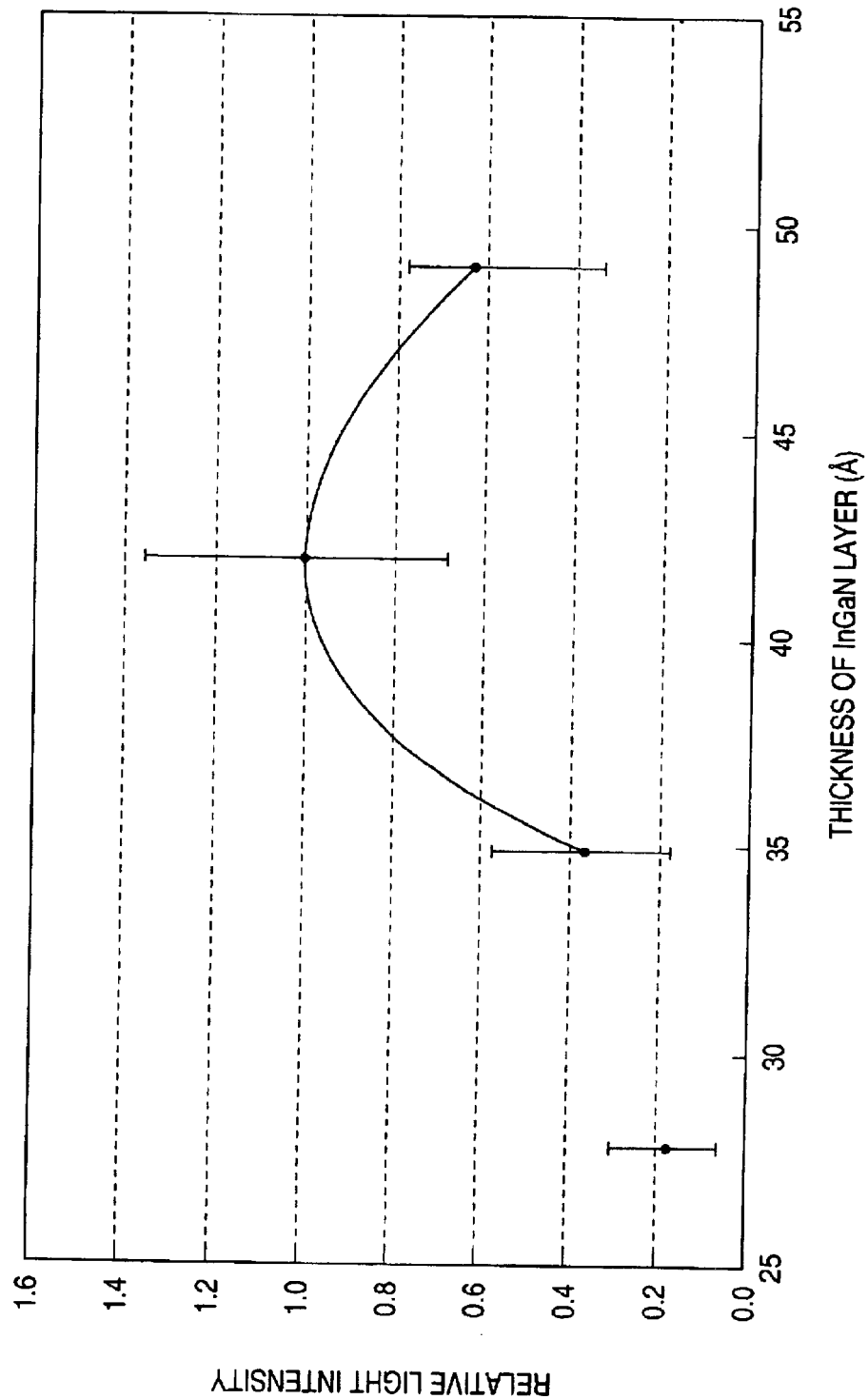
FIG. 1 illustrates the relationship between the thickness of InGaN layer which is a well layer and the light intensity of the light-emitting device.

In the drawings, the reference numeral 1 indicates a light-emitting diode, the reference numeral 13 indicates a n-type contact layer, the reference numeral 14 indicates an interlayer, the reference numeral 15 indicates a light-emitting layer, the reference numeral 15a indicates a clad layer, the reference numeral 15b indicates a well layer, the reference numeral 15c indicates a barrier layer, the reference numeral 16 indicates a p-type clad layer, and the reference numeral 18 indicates a p-type contact layer.

BEST MODE FOR CARRYING OUT THE INVENTION

The present invention will be described in detail hereinafter.

In one aspect of the present invention, the range of wavelength within which the enhancement of light emission output is aimed at is from 360 to 550 nm. In the present invention, the range of wavelength within which the enhancement of light emission output is aimed at is preferably from 360 to 520 nm, more preferably from 360 to 490 nm, even more preferably from 360 to 460 nm, most preferably from 360 to 430 nm.

In this specification, the group III nitride compound semiconductor light-emitting device is represented by a general formula $Al_XGa_YIn_{1-X-Y}N$ ($0 \leq X \leq 1$, $0 \leq Y \leq 1$, $0 \leq X+Y \leq 1$) and includes AlN, a so-called binary system of GaN and InN and a so-called ternary system of $Al_XGa_{1-X}N$, $Al_XIn_{1-X}N$ and $Ga_XIn_{1-X}N$ ($0<x<1$ hereinabove). Some of the group III elements may be replaced by boron (B), thallium (Tl), etc. Some of the nitrogen (N) atoms may be replaced by phosphorus (P), arsenic (As), antimony (Sb), bismuth (Bi), etc. The group III nitride compound semiconductor layer may contain arbitrary dopants. As the n-type impurities there may be used Si, Ge, Se, Te, C, etc. As the p-type impurities there may be used Mg, Zn, Be, Ca, Sr, Ba, etc. The group III nitride compound semiconductor which has been doped with p-type impurities may be then irradiated with electron rays or plasma or subjected to heating in a furnace. The method for forming the group III nitride compound semiconductor layer is not specifically limited, but the group III nitride compound semiconductor layer may be formed by known molecular beam epitaxy method (MBE method), hydride vapor phase epitaxy method (HVPE method), sputtering method, ion plating method, electron shower method or the like besides a metal organic chemical vapor deposition method (MOCVD method).

In the present invention, a specific group III nitride compound semiconductor is used to form a specific layer.

The light-emitting layer of the present invention comprises a well layer made of InGaN layer and a barrier layer made of AlGaN layer. The light-emitting layer of the present invention has a laminated structure having an InGaN layer interposed between AlGaN layers on both sides thereof.

In another aspect, the light-emitting layer one or more unit pairs each comprising a laminate of AlGaN layer and InGaN layer and said AlGaN layer laminated thereon as a final, i.e., outermost layer. In other words, an AlGaN layer is provided on the p-type contact layer side of the light-emitting layer. On the other hand, the n-type contact layer side of the light-emitting layer is made of AlGaN layer or InGaN layer. The number of the unit pairs is preferably from 1 to 10, more preferably from 2 to 8, even more preferably from 3 to 7, further even more preferably from 3 to 6, most preferably 3.5.

The wavelength of light emitted by the light-emitting layer depends mainly on the composition ratio of In and Ga in InGaN layer.

In order to emit short wavelength light, it is preferred that the composition ratio of In be from 4 to 20%, more preferably from 4 to 15%, even more preferably from 4 to 10%, most preferably from 4 to 8%.

The relationship between the thickness of InGaN layer which is a well layer and the light intensity of the light-emitting device at 20 mA is shown in FIG. 1 (The light intensity of the light-emitting device will hereinafter represent the light intensity of the light-emitting device measured under the application of 20 mA unless otherwise specified). The results of FIG. 1 were obtained when the thickness of three InGaN layers constituting the light-emitting layer in the light-emitting device 1 shown in the examples (see FIGS. 7 and 8) were varied as in the abscissa.

It can be seen in the results of FIG. 1 that the thickness of InGaN layer is preferably from 35 to 50 angstrom (3.5 to 5.0 nm), more preferably from 37 to 48 angstrom (3.7 to 4.8 nm), even more preferably from 40 to 45 angstrom (4.0 to 4.5 nm).

Figure 2:
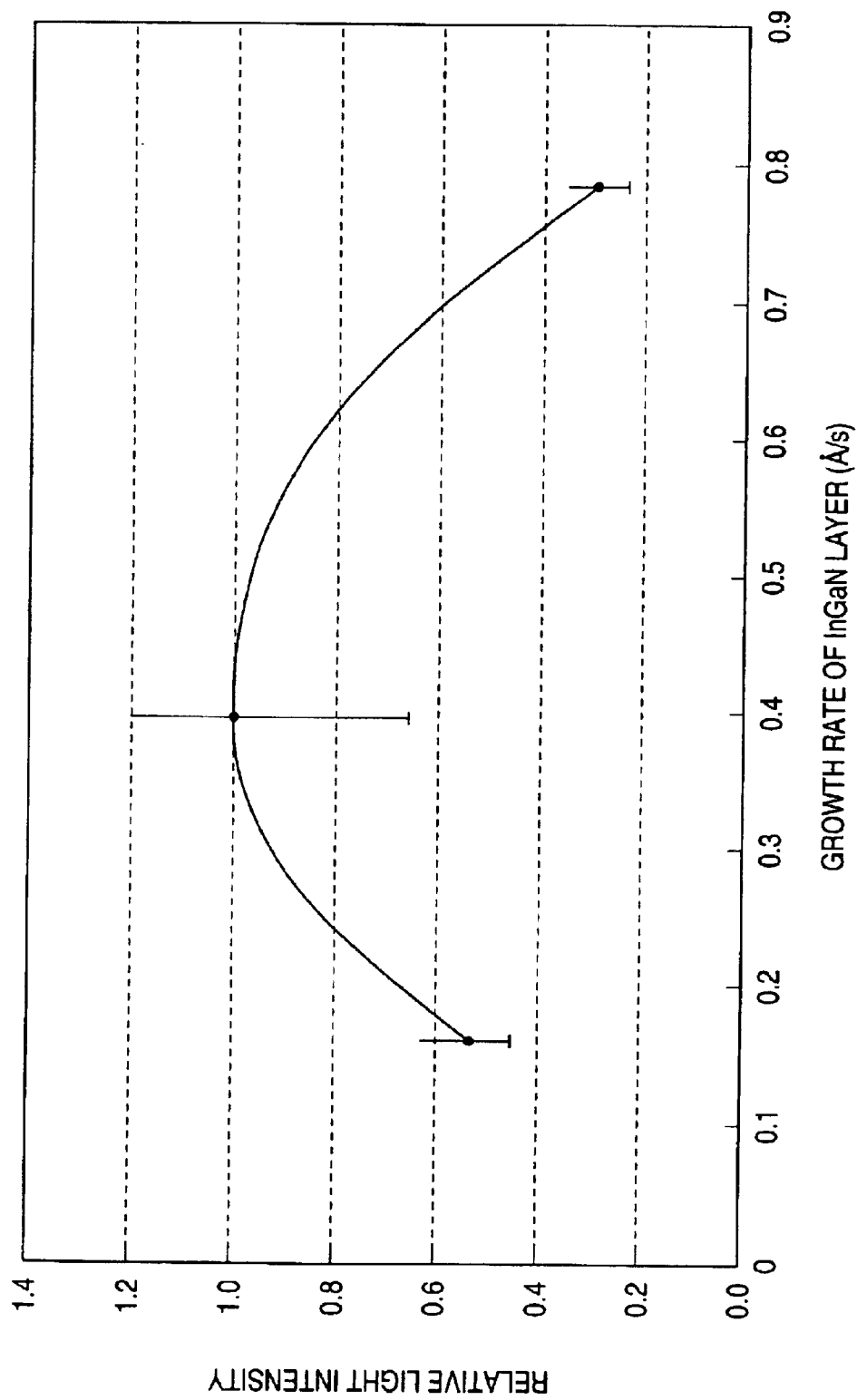
FIG. 2 illustrates the relationship between the growth rate of InGaN layer and the light intensity of the light-emitting device.

The relationship between the growth rate of InGaN layer and the light emission intensity of the light-emitting device is shown in FIG. 2.

The results of FIG. 2 were obtained when the growth rate of InGaN layer constituting the light-emitting layer in the light-emitting device shown in the examples was varied as in the abscissa.

It can be seen in the results of FIG. 2 that the growth rate of InGaN layer is preferably from 0.2 to 0.7 angstrom/s (0.02 to 0.07 nm/s). The growth rate of InGaN layer is more preferably from 0.25 to 0.6 angstrom/s (0.025 to 0.06 nm/s), even more preferably from 0.35 to 0.5 angstrom/s (0.035 to 0.05 nm/s).

In order to obtain the results of FIG. 2, the growth rate was controlled by varying the flow rate of material gases (TMG, TMI, ammonia).

Figure 3:
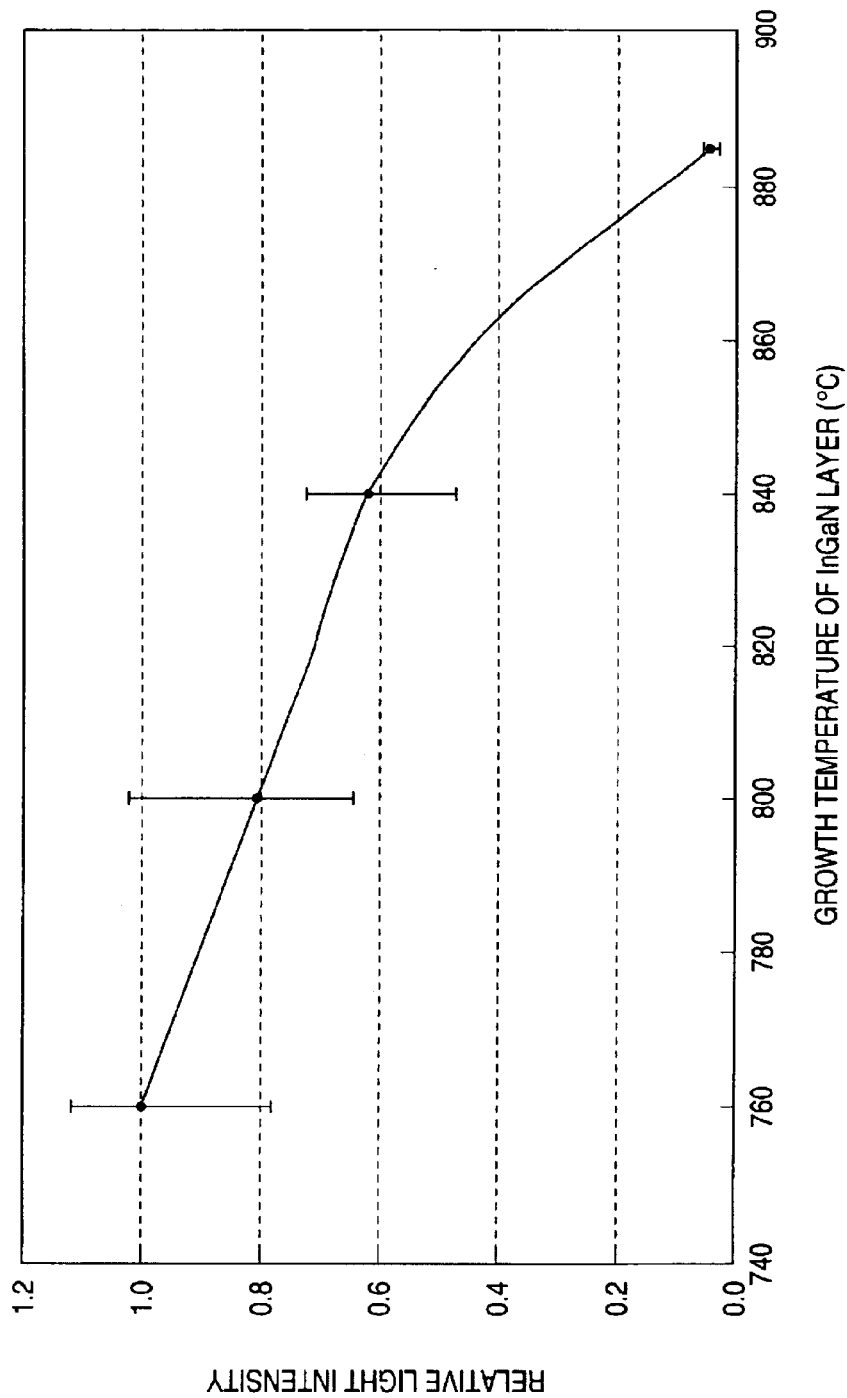
FIG. 3 illustrates the relationship between the growth temperature of InGaN layer and the light intensity of the light-emitting device.

The relationship between the growth temperature of InGaN layer and the light emission intensity of the light-emitting device is shown in FIG. 3.

The results of FIG. 3 were obtained when the growth temperature of InGaN layer constituting the light-emitting layer in the light-emitting device shown in the examples was varied as in the abscissa.

It can be seen in the results of FIG. 3 that the growth temperature of InGaN layer be preferably 850° C. or lower, more preferably 840° C. or lower. The lower limit of the growth temperature of InGaN layer is not specifically limited so far as InGaN layer can grow.

Figure 4:
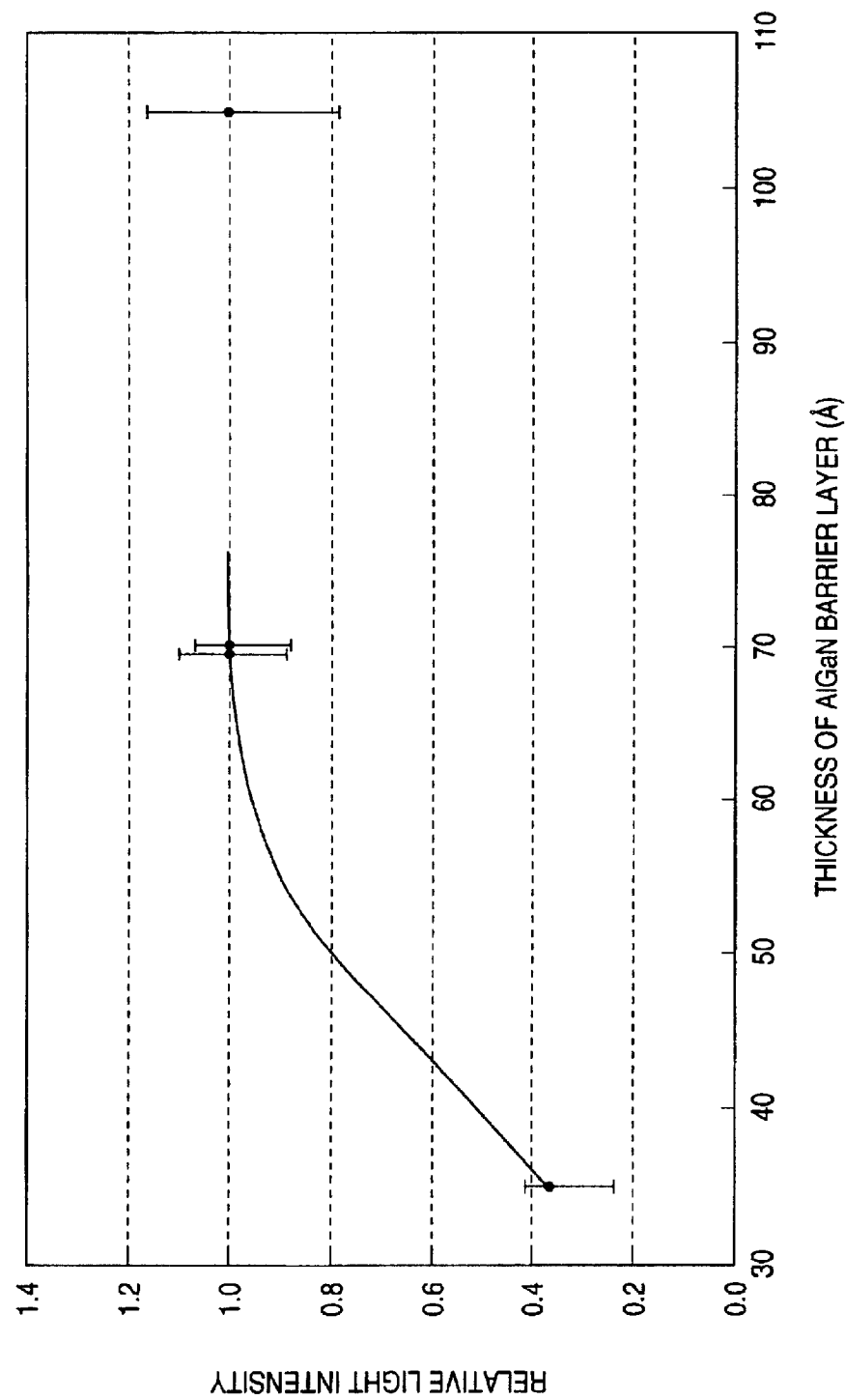
FIG. 4 illustrates the relationship between the thickness of AlGaN layer which is a barrier layer and the light intensity of the light-emitting device.

The relationship between the thickness of AlGaN layer which is a barrier layer and the light emission intensity of The light-emitting device is shown in FIG. 4. The results of FIG. 4 were obtained when the thickness of four AlGaN layers constituting the light-emitting layer in the light-emitting device shown in the examples were varied as in the abscissa.

It can be seen in the results of FIG. 4 that the thickness of AlGaN layer be preferably 50 angstrom (5.0 nm) or more, more preferably 60 angstrom (6.0 nm) or more, even more preferably 70 angstrom (7.0 nm) or more. The upper limit of AlGaN layer is not specifically limited but is preferably from 100 to 500 angstrom (10 to 50 nm) from the standpoint of production step, etc.

The AlGaN layer disposed closest to the p-type contact layer acts as a cap layer and thus is preferably formed 10 to 30% thicker than the other AlGaN layers.

Figure 9:
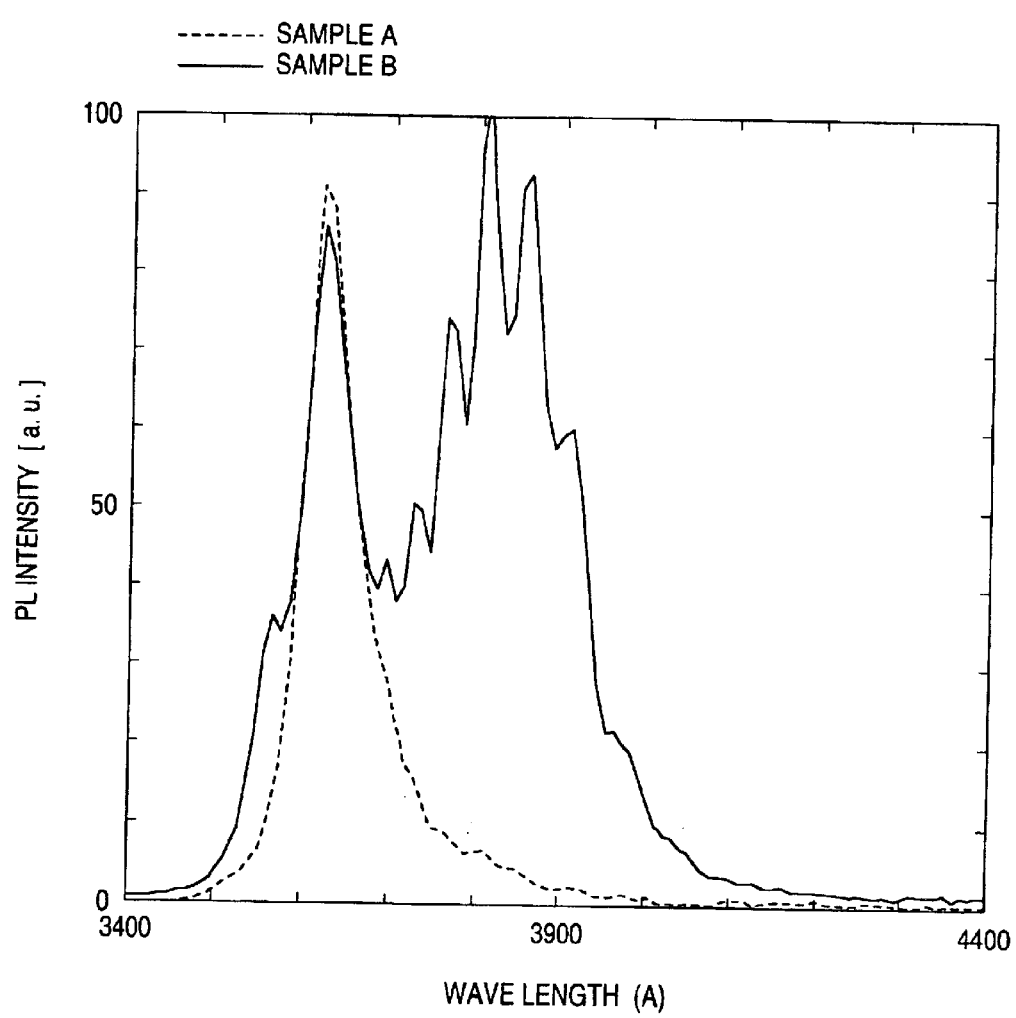
FIG. 9 illustrates the relationship between the thickness of a unit pair of InGaN well layer and AlGaN barrier layer and the PL light intensity of the light-emitting device.

Next, the relationship between the thickness of a unit pair of InGaN layer as a well layer and AlGaN layer as a barrier layer adjacent thereto and the photoluminescence (PL) light intensity of the light-emitting device is shown in FIG. 9. The results of FIG. 9 illustrate PL spectrum developed when a laminate according to the embodiment shown in FIG. 7 (buffer layer was formed at a low temperature) was irradiated with He—Cd laser beam. In the drawing, Sample A shown by the solid line indicates the case where the thickness of one unit pair is 16 nm (160 angstrom) and Sample B shown by the broken line indicates the case where the thickness of one unit pair is 8 nm (80 angstrom). As can be seen in the results of FIG. 9, Sample B showed little emission of light having a wavelength attributed to the light-emitting layer (385 nm or more) while Sample A showed a strong emission of light at this wavelength. The emission of light in the vicinity of 370 nm is attributed to GaN layer of the element.

It can be seen in the results of FIG. 9 that the thickness of one unit pair is preferably 10 nm or more, more preferably from 10 to 100 nm, even more preferably from 10 to 50 nm, further even more preferably from 10 to 20 nm.

Figure 7:
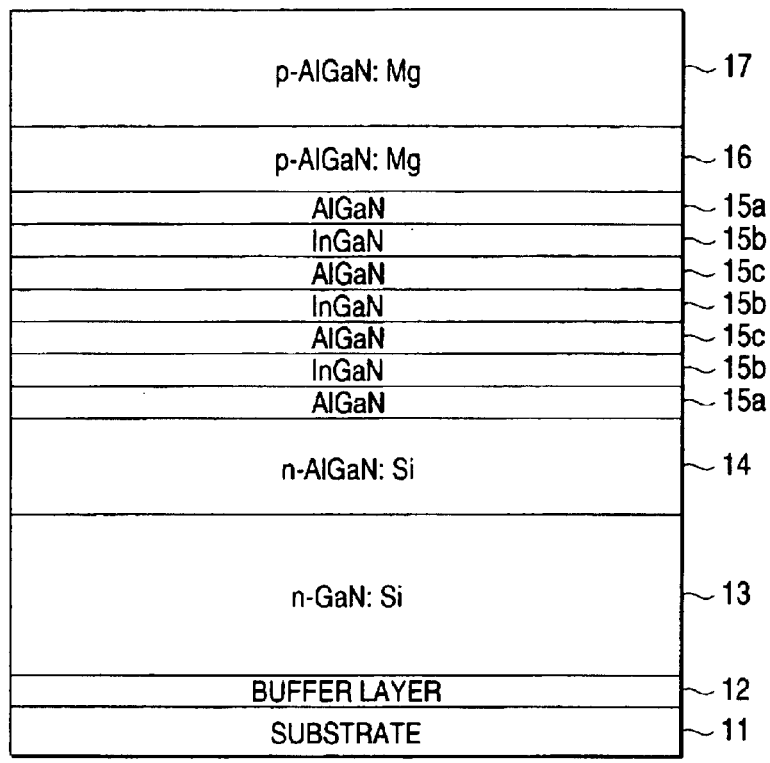
FIG. 7 illustrates the laminated structure of a group III nitride compound semiconductor light-emitting device according to an embodiment of the present invention.

The thickness of the well layer and the barrier layer are each not specifically limited, but the results of FIG. 7 were obtained by keeping the ratio of thickness of well layer to thickness of barrier layer to about 3:7.

The reason why as the thickness of the well layer and the barrier layer increase, the light emission intensity increases is considered as follows. In other words, since the thickness of the barrier layer increases, carrier leakage can be prevented and the diffusion of Mg from the p-layer side can be prevented. Further, as the thickness of the well layer increases to some extent, carriers can be sufficiently confined. As the total thickness of these layers increases, the crystallinity of the light-emitting layer is enhanced.

A further aspect of the present invention focuses on the interlayer made of AlGaN which is a primary coat for the light-emitting layer.

Figure 5:
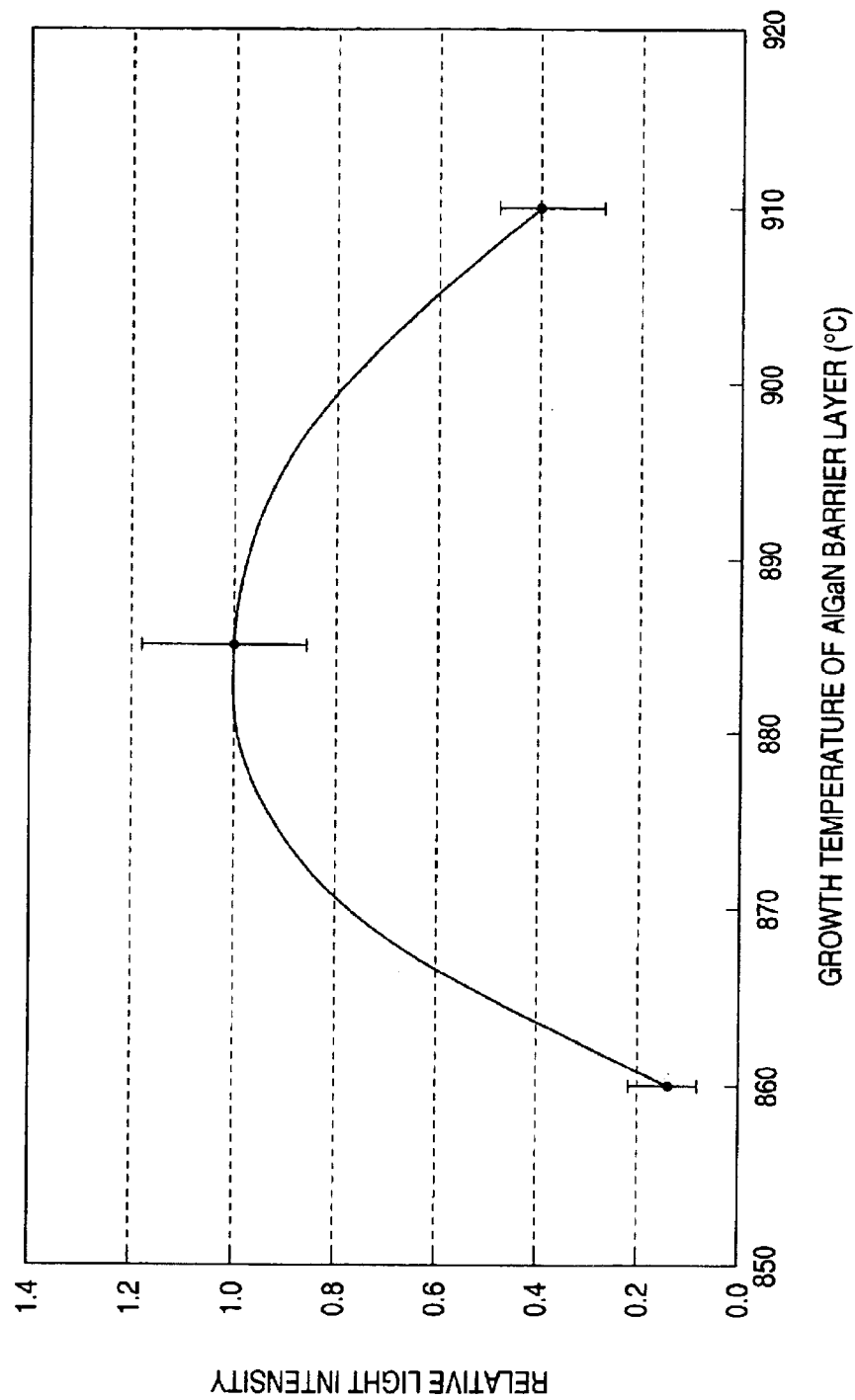
FIG. 5 illustrates the relationship between the growth temperature of a first AlGaN layer and the light intensity of the light-emitting device.

The relationship between the growth temperature of AlGaN interlayer and the light emission intensity of the light-emitting device is shown in FIG. 5.

The results of FIG. 5 were obtained when the growth temperature of AlGaN interlayer (first interlayer) which is a primary coat for the light-emitting layer was varied as in the abscissa.

It can be seen in the results of FIG. 5 that the growth temperature of AlGaN interlayer is preferably from 865 to 905° C., more preferably from 870 to 900° C., even more preferably from 880 to 890° C.

Figure 6:
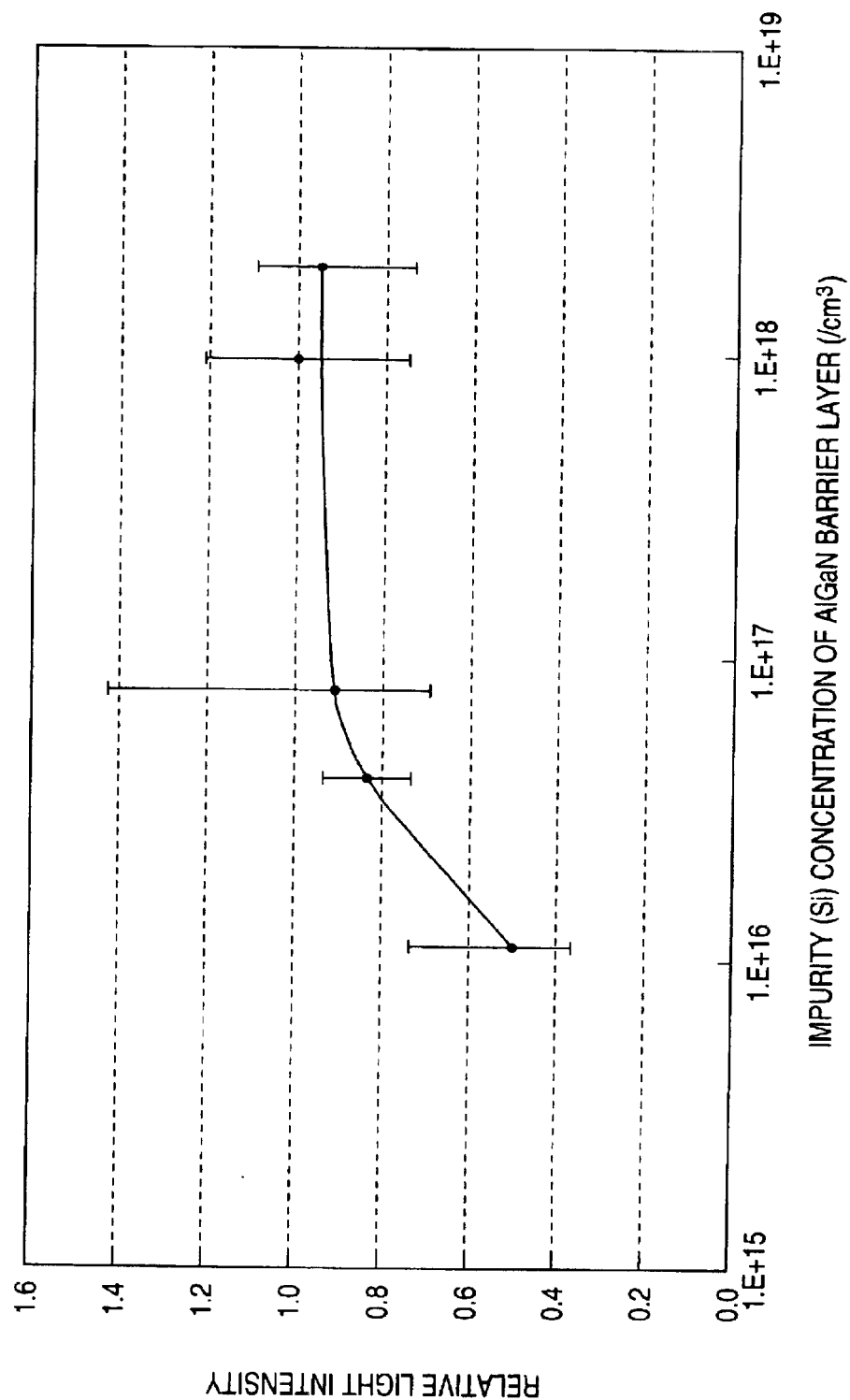
FIG. 6 illustrates the relationship between the impurity concentration of the first AlGaN layer and the light intensity of the light-emitting device.

The relationship between the impurity concentration of AlGaN interlayer and the light emission intensity of the light-emitting device is shown in FIG. 6.

The results of FIG. 6 were obtained when the impurity concentration of AlGaN interlayer which is a primary coat for the light-emitting layer in the light-emitting device shown in the examples was varied in the abscissa.

It can be seen in the results of FIG. 6 that the impurity concentration of AlGaN interlayer is preferably $2\times10^{16}/cm^3$ or more, more preferably $1\times10^{17}/cm^3$. The upper limit of the impurity concentration is not specifically limited but is preferably $1\times10^{19}/cm^3$ or less.

In the example of FIG. 6, AlGaN interlayer was doped with Si as an impurity.

The thickness of AlGaN interlayer is not specifically limited but is preferably from 100 to 300 nm.

Examples of the present invention will be described hereinafter.

The semiconductor laminated structure of a light-emitting diode 1 of the embodiment is shown in FIG. 7.

The specification of various layers are as follows.

Layer: Composition: Dopant (thickness)
p-type contact layer 17: p-$Al_{0.02}Ga_{0.98}N$: Mg (75 nm)
p-type clad layer 16: p-$Al_{0.10-0.45}Ga_{0.90-0.55}N$: Mg (less than 70 nm)
Light-emitting layer 15: Multiple Quantum Well
Clad layer 15a: $Al_{0.04-0.10}Ga_{0.96-0.90}N$ (5–10.5 nm)
Well layer 15b: $In_{0.06-0.07}Ga_{0.94-0.93}N$ (3.5–5 nm)
Barrier layer 15c: $Al_{0.04-0.10}Ga_{0.96-0.90}N$ (5–10.5 nm).
Interlayer 14: n-$Al_{0.04-0.06}Ga_{0.96-0.90}N$: Si (100–300 nm)
n-type contact layer 13: n-GaN: Si (4 μm)
Buffer layer 12: AlN (20 nm)
Substrate 11: Sapphire (a plane) (350 μm)

It is provided that the carrier concentration is as follows.

The carrier concentration in the p-type contact layer 17 is $1\times10^{17}/cm^3$ or more.

The carrier concentration in the p-type clad layer 16 is from 0.5 to $2.0\times10^{17}/cm^3$.

The carrier concentration in the interlayer 14 is $2.0\times10^{18}/cm^3$ or more.

The carrier concentration in the n-type contact layer 13 is $1.0\times10^{18}/cm^3$ or more. The substrate temperature (growth temperature) was 1,000° C. or higher for n-type contact layer 13, p-type clad layer 16 and p-type contact layer 17. As the buffer layer there may be used a so-called low temperature buffer layer as well, but a high temperature buffer layer is used in the present example (see Japanese Patent Publication No. JP 2001-15443A).

The substrate 11 of the aforementioned light-emitting diode 1 is formed by sapphire, but the present invention is not limited thereto. Examples of the substrate material include spinel ($MgAl_2O_4$), SiC (including 6H, 4H, 3C), zinc oxide (ZnO), zinc sulfide (ZnS), magnesium oxide, group III nitride compound semiconductor single crystal (GaAs, GaP, etc.), and silicon (Si).

The light-emitting diode having the aforementioned arrangement is produced in the following manner.

Firstly, said sapphire substrate 11 is heated to 1,130° C. in the stream of a hydrogen gas through the reactor in MOCVD device to clean the surface thereof (a plane).

Thereafter, TMA and $NH_3$ are introduced into the reactor at that substrate temperature to allow a buffer layer 12 made of AlN to grow in MOCVD method.

Subsequently, an n-type contact layer 13 is formed with the substrate temperature being kept at 1,130° C. Subsequent group III nitride compound semiconductor layers 14 to 17 are formed according to an ordinary method (MOCVD method).

In MOCVD method, ammonia gas and gas of alkylated group III compound such as trimethyl gallium (TMG), trimethyl aluminum (TMA) and trimethyl indium (TMI) are supplied onto a substrate which has been heated to a proper temperature to undergo pyrolysis reaction, thereby allowing a desired crystal to grow on the substrate. As an impurity there is used silane or disilane to introduce silicon into the substrate. As an impurity there is used $(RC_5H_4)_2Mg$ to introduce magnesium (Mg) into the substrate.

As already mentioned, the substrate temperature at which the first interlayer 14 is allowed to grow is preferably from 865 to 905° C. (see FIG. 5) and is 885° C. in the present example.

The substrate temperature at which InGaN layer 15b in the light-emitting layer 15 is allowed to grow is preferably 850° C. or lower as shown in FIG. 3 and is 840° C. in the present example.

The growth temperature of AlGaN layer 15a in the light-emitting layer 15 is not specifically limited so far as the well layer containing indium (In) doesn't disappear, but the substrate temperature is 885° C. in the present example.

The substrate temperature of p-type clad layer 16 and p-type contact layer were kept at 1,000° C.

Figure 8:
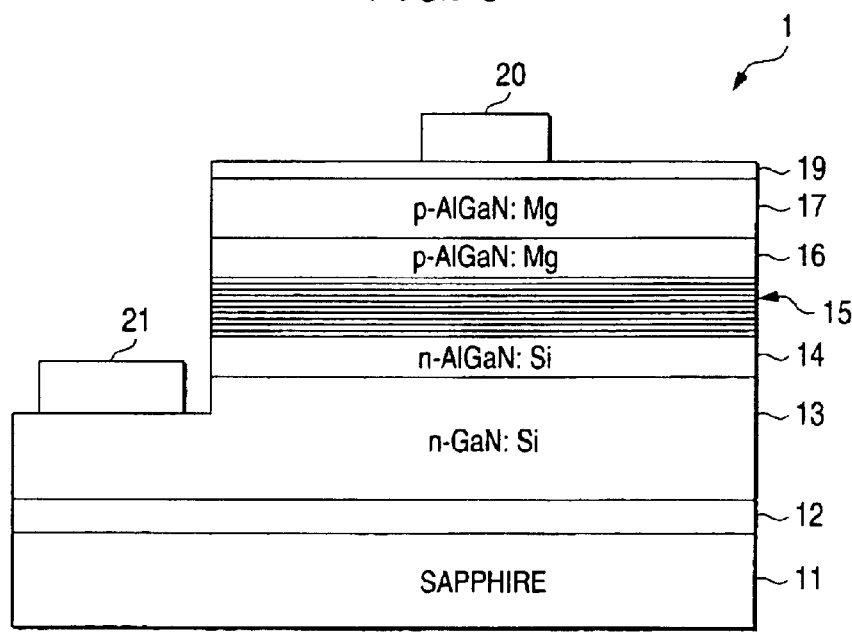
FIG. 8 illustrates the arrangement of the light-emitting diode according to the embodiment of the present invention.

Subsequently, the semiconductor layer is partly removed by ion etching with Ti/Ni as a mask to expose the n-type contact layer 13 on which an n-electrode pad 21 is to form (see FIG. 8).

A photoresist is then uniformly applied to the surface of the semiconductor. The semiconductor is then subjected to photolithography to remove the photoresist from the p-type contact layer 17 at the area where the electrode is formed so that the p-type contact layer 17 is exposed at that area. Using a vacuum metallizer, an Au—Co light-transmitting electrode layer 19 is formed on the p-type contact layer 17 thus exposed.

Subsequently, a p-electrode pad 20 and an n-electrode pad 21 are vacuum-deposited similarly.

The light-emitting diode thus arranged was able to emit light having a wavelength of 382 nm.

INDUSTRIAL APPLICABILITY

The present invention is by no means limited to the aforementioned embodiments of implementation of the present invention and the description of the examples. Various modifications are included in the present invention without departing from the description of claims so far as they can be easily anticipated by those skilled in the art.

The disclosures in the specification will be listed below.

Firstly, a group III nitride compound semiconductor light-emitting device comprising a light-emitting layer having a portion where an InGaN layer is interposed between AlGaN layers on both sides thereof is disclosed. Herein, the thickness of InGaN layer may be predetermined to a range of from 3.5 to 5 nm. Further, the thickness of AlGaN layer may be predetermined to 5 nm or more. Moreover, InGaN layer may be formed at a growth rate of from 0.02 to 0.07 nm/s. Further, InGaN layer may be formed at a growth temperature of 850° C. or lower. The thickness of InGaN layer, thickness of AlGaN layer, growth rate of InGaN layer and growth temperature of InGaN layer may be applied in arbitrary combination. Further, the light-emitting layer may comprise one or more unit pairs each comprising a laminate of said AlGaN layer and said InGaN layer and said AlGaN layer laminated thereon as an outermost layer. Moreover, the light-emitting device may comprise an interlayer made of AlGaN having a growth temperature of from 865 to 905° C. and/or an impurity concentration of $2 \times 10^{16}/cm^3$ or more and said light-emitting layer formed on said interlayer.

Secondly, a process for the production of a group III nitride compound semiconductor light-emitting device comprising a light-emitting layer having a portion where an InGaN layer is interposed between AlGaN layers on both sides thereof is disclosed and said process employs any of (i) step of forming InGaN layer at a growth rate of from 0.02 to 0.07 nm/s, (ii) step of forming InGaN layer at a growth temperature of 850° C. or lower and (iii) step of forming an interlayer made of AlGaN at a growth temperature of from 865 to 905° C. before the formation of interlayer. These steps (i) to (iii) may be applied in arbitrary combination. In any of the aforementioned steps, the light-emitting layer may comprise one or more unit pairs each comprising a laminate of said AlGaN layer and said InGaN layer and said AlGaN layer laminated thereon as an outermost layer.

Moreover, the light-emitting layer may be formed so as to emit light having a wavelength of from 360 to 550 nm or from 360 to 430 nm.

Further, the thickness of the aforementioned InGaN layer may be predetermined to a range of from 3.5 to 5 nm and the thickness of the aforementioned AlGaN layer may be predetermined to 5 nm or more.

In the step (iii), the aforementioned interlayer may have an impurity concentration of $2 \times 10^{16}/cm^3$ or more.

Thirdly, a laminate for group III nitride compound semiconductor light-emitting device which emits light having a wavelength of from 360 to 550 nm, comprising a light-emitting layer having a portion where an InGaN layer is interposed between AlGaN layers on both sides thereof, is disclosed. Herein, the thickness of InGaN layer may be predetermined to a range of from 3.5 to 5 nm. Further, the thickness of AlGaN layer may be predetermined to 5 nm or more. Moreover, InGaN layer may be formed at a growth rate of from 0.02 to 0.07 nm/s. Further, InGaN layer maybe formed at a growth temperature of 850° C. or lower. The thickness of InGaN layer, thickness of AlGaN layer, growth rate of InGaN layer and growth temperature of InGaN layer may be applied in arbitrary combination. Further, the light-emitting layer may comprise one or more unit pairs each comprising a laminate of said AlGaN layer and said InGaN layer and said AlGaN layer laminated thereon as an outermost layer. Moreover, the light-emitting device may comprise an interlayer made of AlGaN having a growth temperature of from 865 to 905° C. and/or an impurity concentration of $2 \times 10^{16}/cm^3$ or more and said light-emitting layer formed on said interlayer.

Fourthly, a laminate which emits light having a wavelength of from 360 to 550 nm or from 360 to 430 nm from a light-emitting layer, comprising an interlayer made of AlGaN having a growth temperature of from 865 to 905° C. and/or an impurity concentration of $2 \times 10^{16}/cm^3$ or more and said light-emitting layer formed on said interlayer, is disclosed.

Fifthly, a laminate comprising a light-emitting layer having a portion where an InGaN layer is interposed between AlGaN layers on both sides thereof is disclosed. Herein, the thickness of InGaN layer may be predetermined to a range of from 3.5 to 5 nm. Further, the thickness of AlGaN layer maybe predetermined to 5 nm or more. Moreover, InGaN layer maybe formed at a growth rate of from 0.02 to 0.07 nm/s. Further, InGaN layer may be formed at a growth temperature of 850° C. or lower. The thickness of InGaN layer, thickness of AlGaN layer, growth rate of InGaN layer and growth temperature of INGaN layer may be applied in arbitrary combination. Further, the light-emitting layer may comprise one or more unit pairs each comprising a laminate of said AlGaN layer and said InGaN layer and said AlGaN layer laminated thereon as an outermost layer. Moreover, the light-emitting device may comprise an interlayer made of AlGaN having a growth temperature of from 865 to 905° C. and/or an impurity concentration of $2 \times 10^{16}/cm^3$ or more and said light-emitting layer formed on said interlayer.

Sixthly, a process for the production of a laminate comprising a light-emitting layer having a portion where an InGaN layer is interposed between AlGaN layers on both sides thereof is disclosed and said process employs any of (i) step of forming InGaN layer at a growth rate of from 0.02 to 0.07 nm/s, (ii) step of forming InGaN layer at a growth temperature of 850° C. or lower and (iii) step of forming an interlayer made of AlGaN at a growth temperature of from 865 to 905° C. before the formation of interlayer. These steps (i) to (iii) may be applied in arbitrary combination. In any of the aforementioned steps, the light-emitting layer may comprise one or more unit pairs each comprising a laminate of said AlGaN layer and said InGaN layer and said AlGaN layer laminated thereon as an outermost layer.

Moreover, the light-emitting layer may be formed so as to emit light having a wavelength of from 360 to 550 nm or from 360 to 430 nm.

Further, the thickness of the aforementioned InGaN layer may be predetermined to a range of from 3.5 to 5 nm and the thickness of the aforementioned AlGaN layer may be predetermined to 5 nm or more.

In the step (iii), the aforementioned interlayer may have an impurity concentration of $2 \times 10^{16}/cm^3$ or more.

Seventhly, a group III nitride compound semiconductor light-emitting device which emits light having a wavelength of from 360 t 550 nm, comprising a light-emitting layer having a portion where an InGaN layer is interposed between AlGaN layers on both sides thereof wherein the sum of the thickness of one said InGaN layer and one said AlGaN layer laminated continuously on said InGaN layer is 10 nm or more, is disclosed. Herein, the thickness of InGaN layer may be predetermined to a range of from 3.5 to 5 nm. Further, the thickness of AlGaN layer may be predetermined to 5 nm or more. Moreover, InGaN layer may be formed at a growth rate of from 0.02 to 0.07 nm/s. Further, InGaN layer maybe formed at a growth temperature of 850° C. or lower. The thickness of InGaN layer, thickness of AlGaN layer, growth rate of InGaN layer and growth temperature of InGaN layer may be applied in arbitrary combination. Further, the light-emitting layer may comprise one or more unit pairs each comprising a laminate of said AlGaN layer and said InGaN layer and said AlGaN layer laminated thereon as an outermost layer. Moreover, the light-emitting device may comprise an interlayer made of AlGaN having a growth temperature of from 865 to 905° C. and/or an impurity concentration of $2 \times 10^{16}/cm^3$ or more and said light-emitting layer formed on said interlayer.

Eighthly, a group III nitride compound semiconductor light-emitting device comprising a light-emitting layer having a portion where an InGaN layer is interposed between AlGaN layers on both sides thereof wherein the sum of the thickness of one said InGaN layer and one said AlGaN layer laminated continuously on said InGaN layer is 10 nm or more is disclosed. Herein, the thickness of InGaN layer may be predetermined to a range of from 3.5 to 5 nm. Further, the thickness of AlGaN layer may be predetermined to 5 nm or more. Moreover, InGaN layer may be formed at a growth rate of from 0.02 to 0.07 nm/s. Further, InGaN layer may be formed at a growth temperature of 850° C. or lower. The thickness of InGaN layer, thickness of AlGaN layer, growth rate of InGaN layer and growth temperature of InGaN layer may be applied in arbitrary combination. Further, the light-emitting layer may comprise one or more unit pairs each comprising a laminate of said AlGaN layer and said InGaN layer and said AlGaN layer laminated thereon as an outermost layer. Moreover, the light-emitting device may comprise an interlayer made of AlGaN having a growth temperature of from 865 to 905° C. and/or an impurity concentration of $2\times10^{16}/cm^3$ or more and said light-emitting layer formed on said interlayer.

Ninthly, a laminate for group III nitride compound semiconductor light-emitting device which emits light having a wavelength of from 360 t 550 nm, comprising a light-emitting layer having a portion where an InGaN layer is interposed between AlGaN layers on both sides thereof wherein the sum of the thickness of one said InGaN layer and one said AlGaN layer laminated continuously on said InGaN layer is 10 nm or more, is disclosed. Herein, the thickness of InGaN layer may be predetermined to a range of from 3.5 to 5 nm. Further, the thickness of AlGaN layer may be predetermined to 5 nm or more. Moreover, InGaN layer may be formed at a growth rate of from 0.02 to 0.07 nm/s. Further, InGaN layer may be formed at a growth temperature of 850° C. or lower. The thickness of InGaN layer, thickness of AlGaN layer, growth rate of InGaN layer and growth temperature of InGaN layer may be applied in arbitrary combination. Further, the light-emitting layer may comprise one or more unit pairs each comprising a laminate of said AlGaN layer and said InGaN layer and said AlGaN layer laminated thereon as an outermost layer. Moreover, the light-emitting device may comprise an interlayer made of AlGaN having a growth temperature of from 865 to 905° C. and/or an impurity concentration of $2\times10^{16}/cm^3$ or more and said light-emitting layer formed on said interlayer.

Tenthly, a laminate for group III nitride compound semiconductor light-emitting device comprising a light-emitting layer having a portion where an InGaN layer is interposed between AlGaN layers on both sides thereof wherein the sum of the thickness of one said InGaN layer and one said AlGaN layer laminated continuously on said InGaN layer is 10 nm or more is disclosed. Herein, the thickness of InGaN layer may be predetermined to a range of from 3.5 to 5 nm. Further, the thickness of AlGaN layer may be predetermined to 5 nm or more. Moreover, InGaN layer may be formed at a growth rate of from 0.02 to 0.07 nm/s. Further, InGaN layer may be formed at a growth temperature of 850° C. or lower. The thickness of InGaN layer, thickness of AlGaN layer, growth rate of InGaN layer and growth temperature of InGaN layer may be applied in arbitrary combination. Further, the light-emitting layer may comprise one or more unit pairs each comprising a laminate of said AlGaN layer and said InGaN layer and said AlGaN layer laminated thereon as an outermost layer. Moreover, the light-emitting device may comprise an interlayer made of AlGaN having a growth temperature of from 865 to 905° C. and/or an impurity concentration of $2\times10^{16}/cm^3$ or more and said light-emitting layer formed on said interlayer.

What is claimed is:

1. A group III nitride compound semiconductor light-emitting device which emits light having a wavelength of from 360 nm to 550 nm, comprising:
   a light-emitting layer comprising:
      at least one well layer comprising an InGaN layer having a thickness in a range from 3.5 nm to 5 nm; and
      a plurality of AlGaN layers formed on opposing sides of said at least one well layer, at least one of said AlGaN layers comprising a barrier layer.

2. The group III nitride compound semiconductor light-emitting device as described in claim 1, wherein the thickness of one of said AlGaN layers is 5 nm or more.

3. The group III nitride compound semiconductor light-emitting device as described in claim 1, wherein said InGaN layer has been formed at a growth rate of from 0.02 to 0.07 nm/s.

4. The group III nitride compound semiconductor light-emitting device as described in claim 1, wherein said InGaN layer has been formed at a growth temperature of 850° C. or lower.

5. The group III nitride compound semiconductor light-emitting device as described in claim 1, wherein the thickness of one of said AlGaN layers is 5 nm or more and said InGaN layer has been formed at a growth rate of from 0.02 to 0.07 nm/s.

6. The group III nitride compound semiconductor light-emitting device as described in claim 1, wherein the thickness of one of said AlGaN layers is 5 nm or more and said InGaN layer has been formed at a growth temperature of 850° C. or lower.

7. The group III nitride compound semiconductor light-emitting device as described in claim 1, wherein said InGaN layer has been formed at a growth rate of from 0.02 to 0.07 nm/s and said InGaN layer has been formed at a growth temperature of 850° C. or lower.

8. The group III nitride compound semiconductor light-emitting device as described in claim 1, wherein the thickness of one of said AlGaN layers is 5 nm or more, said InGaN layer has been formed at a growth rate of from 0.02 to 0.07 nm/s, and said InGaN layer has been formed at a growth temperature of 850° C. or lower.

9. The group III nitride compound semiconductor light-emitting device as described in claim 1, wherein said light emitting layer comprises one or more unit pairs each comprising a laminate of one of said AlGaN layers and said InGaN layer and another one of said AlGaN layers laminated thereon as an outermost layer.

10. The group III nitride compound semiconductor light-emitting device as described in claim 1, wherein the wavelength of light emitted is in a range from 360 to 430 nm.

11. The group III nitride compound semiconductor light-emitting device as described in claim 1, wherein said light-emitting layer comprises one or more unit pairs each comprising a laminate of one of said AlGaN layers and said InGaN layer and another one of said AlGaN layers laminated thereon as an outermost layer and the wavelength of light emitted is in a range from 360 to 430 nm.

12. The group III nitride compound semiconductor light-emitting device as described in claim 1, further comprising:
   an interlayer disposed adjacent to said light-emitting layer and comprising AlGaN having a growth temperature of from 865 to 905° C.

13. The group III nitride compound semiconductor light-emitting device as described in claim 12, further comprising:
   an n-type contact layer, said interlayer being formed on said n-type contact layer.

14. The group III nitride compound semiconductor light-emitting device as described in claim 1, further comprising:
an interlayer disposed adjacent to said light-emitting layer and comprising AlGaN having an impurity concentration of $2\times10^{16}/cm^3$ or more.

15. The group III nitride compound semiconductor light-emitting device as described in claim 1, further comprising:
an interlayer disposed adjacent to said light-emitting layer and comprising AlGaN having a growth temperature of from 865 to 905° C. and an impurity concentration of $2\times10^{16}/cm^3$ or more.

16. The group III nitride compound semiconductor light-emitting device as described in claim 1, wherein said at least one well layer comprises of plurality of well layers each comprising an InGaN layer, such that said light-emitting layer comprises a multiple-quantum well structure in which said plurality of well layers are separated by one of said AlGaN layers.

17. The group III nitride compound semiconductor light-emitting device as described in claim 1, further comprising:
a p-type contact layer formed on said light-emitting layer, wherein fine of said AlGaN layers is formed adjacent to said p-type contact layer and has a thickness which is greater than a thickness of other said AlGaN layers in said light-emitting layer.

18. The group III nitride compound semiconductor light-emitting device as described in claim 1, wherein said InGaN layer comprises a plurality of InGaN layers, and wherein one of said InGaN layers and an adjacent one of said AlGaN layers forms a unit pair, and wherein said light emitting layer comprises a range of 3 to 6 unit pairs.

19. The group III nitride compound semiconductor light-emitting device as described in claim 18, wherein one of said unit pairs comprises a thickness in a range of 10 to 20 nm.

20. The group III nitride compound semiconductor light-emitting device as described in claim 1, wherein said InGaN layer comprises a composition ratio of In in a range of 4% to 8%.

21. The group Ill nitride compound semiconductor light-emitting device as described in claim 1, wherein a ratio of a thickness of said InGaN layer to a thickness of an adjacent said AlGaN layer is about 3:7.

22. A group III nitride compound semiconductor light-emitting device, comprising:
an interlayer comprising AlGaN having a growth temperature of from 865 to 905° C. and having an impurity concentration of $2\times10^{16}/cm^3$ or more; and
a light-emitting layer formed on said interlayer which emits light having a wavelength of from 360 to 550 nm, and comprises at least one well layer comprising an InGaN layer having a thickness in a range from 3.5 nm. to 5 nm.

23. The group III nitride compound semiconductor light-emitting device as described in claim 22, wherein said light-emitting layer comprises at least one barrier layer comprising an AlGaN layer, and a plurality of well layers formed on opposing sides of said at least one barrier layer, at least one of said well layers comprising an InGaN layer.

24. The group Ill nitride compound semiconductor light-emitting device as described in claim 22, wherein said wavelength is in a range from 360 to 430 nm.

25. A group III nitride compound semiconductor light-emitting device, comprising:
an interlayer comprising AlGaN having an impurity concentration of $2\times10^{16}/cm^3$ or more; and
a light-emitting layer formed on said interlayer which emits light having a wavelength of from 360 to 550 nm, and comprises at least one well layer comprising an InGaN layer having a thickness in a range from 3.5 nm to 5 nm.

26. The group III nitride compound semiconductor light-emitting device as described in claim 25, wherein said wavelength is in a range from 360 to 430 nm.

27. The group III nitride compound semiconductor light-emitting device as described in claim 25, wherein said light-emitting layer comprises at least one barrier layer comprising an AlGaN layer; and a plurality of well layers formed on opposing sides of said at least one barrier layer, at least one of said well layers comprising an InGaN layer.

28. A group III nitride compound semiconductor light-emitting device, comprising:
an n-type contact layer;
an interlayer formed on said n-type contact layer and comprising AlGaN having a growth temperature of from 865 to 905° C. and an impurity concentration of $2\times10^{16}/cm^3$ or more; and
a light-emitting layer formed on said interlayer which emits light having a wavelength of from 360 to 550 nm, and comprises at least one well layer comprising an InGaN layer having a thickness in a range from 3.5 nm to 5 nm.

29. A group III nitride compound semiconductor light-emitting device as described in claim 28, wherein said wavelength is a range from 360 to 430 nm.

30. The group III nitride compound semiconductor light-emitting device as described in claim 28, wherein said light-emitting layer comprises at least one barrier layer comprising an AlGaN layer, and a plurality of well layers formed on opposing sides of said at least one barrier layer, at least one of said well layers comprising an InGaN layer.

31. A group III nitride compound semiconductor light-emitting device which emits light having a wavelength of from 360 to 550 nm, comprising:
a light-emitting layer comprising:
at least one well layer comprising an InGaN layer having a thickness in a range from 3.5 nm to 5 nm; and
a plurality of AlGaN layers formed on opposing sides of said at least one well layer, at least one of said AlGaN layers comprising a barrier layer,
wherein the sum of the thickness of one said InGaN layer and one of said AlGaN layers laminated continuously on said InGaN layer is 10 nm or more.

32. The group III nitride compound semiconductor light-emitting device as described in claim 31, wherein said InGaN layer has been formed at a growth rate of from 0.02 to 0.07 nm/s.

33. The group III nitride compound semiconductor light-emitting device as described in claim 31, wherein said InGaN layer has been formed at a growth temperature of 850° C. or lower.

34. The group III nitride compound semiconductor light-emitting device as described in claim 31, wherein said InGaN layer has been formed at a growth rate of from 0.02 to 0.07 nm/s and said InGaN layer has been formed at a growth temperature of 850° C. or lower.

35. The group III nitride compound semiconductor light-emitting device as described in claim 31, wherein said at least one well layer comprises of plurality of well layers each comprising an InGaN layer, such that said light-emitting layer comprises a multiple-quantum well structure in which said plurality of well layers are separated by one of said AlGaN layers.

* * * * *